United States Patent
Yasuda

(10) Patent No.: US 11,881,841 B2
(45) Date of Patent: Jan. 23, 2024

(54) MULTIPLEXER AND HIGH-FREQUENCY FILTER

(71) Applicant: Murata Manufacturing Co., Ltd., Nagaokakyo (JP)

(72) Inventor: Junpei Yasuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 364 days.

(21) Appl. No.: 16/830,318

(22) Filed: Mar. 26, 2020

(65) Prior Publication Data
US 2020/0228097 A1    Jul. 16, 2020

Related U.S. Application Data

(63) Continuation of application No. PCT/JP2018/037225, filed on Oct. 4, 2018.

(30) Foreign Application Priority Data

Oct. 10, 2017  (JP) .................................. 2017-197048

(51) Int. Cl.
H03H 9/54    (2006.01)
H03H 9/56    (2006.01)
(Continued)

(52) U.S. Cl.
CPC .............. H03H 9/568 (2013.01); H01Q 1/50 (2013.01); H03H 9/70 (2013.01)

(58) Field of Classification Search
CPC ............. H03H 9/568; H03H 9/70; H01Q 1/50
See application file for complete search history.

(56) References Cited

U.S. PATENT DOCUMENTS 9,246,536 B2 * 1/2016 Caron .................. H04B 1/52
10,187,109 B2 * 1/2019 Saji ..................... H04B 1/006
(Continued)

FOREIGN PATENT DOCUMENTS

JP    10-303697 A    11/1998
JP    2008-160562 A    7/2008
(Continued)

OTHER PUBLICATIONS

Official Communication issued in International Patent Application No. PCT/JP2018/037225, dated Dec. 25, 2018.
(Continued)

*Primary Examiner* — Ryan Jager
(74) *Attorney, Agent, or Firm* — Keating & Bennett, LLP

(57) ABSTRACT

A multiplexer includes a plurality of filters, in which one input/output terminal of each of the plurality of filters is connected to a common terminal, a first filter included in the plurality of filters is a ladder filter and includes at least one series arm resonator connected on a path connecting the common terminal and another input/output terminal of the first filter, at least one parallel arm resonator connected between a connection node provided on the path and a ground, and a switch which is connected in series to a parallel arm resonator connected most nearby to the common terminal among at least one parallel arm resonator and switches between conduction and non-conduction of a node to which the parallel arm resonator is connected and the ground.

12 Claims, 8 Drawing Sheets

(51) Int. Cl.
*H01Q 1/50* (2006.01)
*H03H 9/70* (2006.01)

(56) References Cited

U.S. PATENT DOCUMENTS

| | | | | |
|---|---|---|---|---|
| 10,382,006 B2* | 8/2019 | Tsukamoto | ............ | H03H 9/605 |
| 10,382,009 B2* | 8/2019 | Nosaka | ................... | H04B 1/00 |
| 10,530,335 B2* | 1/2020 | Nosaka | ................ | H03H 9/6483 |
| 10,566,951 B2* | 2/2020 | Nosaka | ................... | H03H 9/64 |
| 10,567,031 B2* | 2/2020 | Nosaka | ................... | H03H 9/6403 |
| 10,644,673 B2* | 5/2020 | Nosaka | ................. | H04B 1/006 |
| 10,659,086 B2* | 5/2020 | Khlat | ................... | H04B 1/005 |
| 10,700,659 B2* | 6/2020 | Tani | ........................ | H04B 1/52 |
| 10,715,107 B2* | 7/2020 | Nosaka | ................. | H03H 9/542 |
| 10,715,109 B2* | 7/2020 | Matsutani | .............. | H03H 9/605 |
| 10,715,112 B2* | 7/2020 | Nosaka | ................. | H03H 9/725 |
| 10,720,903 B2* | 7/2020 | Nosaka | ................. | H03H 9/205 |
| 10,727,810 B2* | 7/2020 | Nosaka | ............. | H03H 9/02818 |
| 10,742,193 B2* | 8/2020 | Wada | ................. | H03H 9/0542 |
| 10,763,825 B2* | 9/2020 | Nosaka | ................. | H03H 9/6489 |
| 10,812,048 B2* | 10/2020 | Nosaka | ................. | H03H 9/6483 |
| 10,840,886 B2* | 11/2020 | Nosaka | ..................... | H03F 3/19 |
| 10,862,456 B2* | 12/2020 | Nosaka | ................. | H03H 9/205 |
| 10,886,892 B2* | 1/2021 | Nosaka | ..................... | H03H 9/25 |
| 10,911,027 B2* | 2/2021 | Nosaka | ................. | H03H 11/34 |
| 10,944,381 B2* | 3/2021 | Tsukamoto | ............. | H03H 9/54 |
| 10,958,242 B2* | 3/2021 | Tsukamoto | ............ | H03H 9/542 |
| 10,979,027 B2* | 4/2021 | Nosaka | .................... | H03F 3/19 |
| 11,012,050 B2* | 5/2021 | Nosaka | ................... | H03H 9/17 |
| 11,031,921 B2* | 6/2021 | Nosaka | ................. | H03H 9/725 |
| 11,115,002 B2* | 9/2021 | Nosaka | ............... | H03H 9/6426 |
| 11,139,798 B2* | 10/2021 | Nosaka | ................... | H04B 1/00 |
| 11,211,917 B2* | 12/2021 | Nosaka | ............. | H03H 9/02275 |
| 11,264,971 B2* | 3/2022 | Mori | ...................... | H03H 9/725 |
| 11,316,499 B2* | 4/2022 | Nosaka | ................... | H04B 1/52 |
| 11,349,508 B2* | 5/2022 | Hitomi | ................... | H04B 1/006 |
| 11,394,368 B2* | 7/2022 | Nosaka | ................... | H04B 1/18 |
| 11,476,835 B2* | 10/2022 | Nosaka | ................... | H04B 1/40 |
| 11,489,514 B2* | 11/2022 | Nosaka | ................ | H03H 9/6476 |
| 11,563,421 B2* | 1/2023 | Khlat | ................ | H03H 9/02023 |
| 2008/0150652 A1 | 6/2008 | Itou | | |
| 2009/0201104 A1* | 8/2009 | Ueda | .................... | H03H 9/6483 |
| | | | | 333/195 |
| 2009/0251235 A1* | 10/2009 | Belot | ...................... | H03H 9/542 |
| | | | | 333/187 |
| 2011/0299432 A1* | 12/2011 | Caron | ...................... | H04B 1/52 |
| | | | | 370/277 |
| 2014/0341090 A1* | 11/2014 | Kawachi | ................ | H04L 5/1461 |
| | | | | 370/278 |
| 2015/0303973 A1 | 10/2015 | Wloczysiak | | |
| 2016/0301383 A1 | 10/2016 | Tani | | |
| 2017/0155375 A1 | 6/2017 | Schmidhammer | | |
| 2018/0226948 A1* | 8/2018 | Sung | ..................... | H03H 9/587 |
| 2019/0036508 A1 | 1/2019 | Tsukamoto et al. | | |
| 2019/0097606 A1 | 3/2019 | Nosaka et al. | | |
| 2019/0115947 A1* | 4/2019 | Nosaka | ................... | H04B 1/50 |
| 2020/0228097 A1* | 7/2020 | Yasuda | ................ | H03H 9/6403 |
| 2021/0184706 A1* | 6/2021 | Hisano | ................... | H03H 7/075 |
| 2022/0385272 A1* | 12/2022 | Sun | ........................ | H03H 9/725 |
| 2022/0385273 A1* | 12/2022 | Sun | ........................ | H03H 9/725 |

FOREIGN PATENT DOCUMENTS

| | | |
|---|---|---|
| JP | 2010-252254 A | 11/2010 |
| JP | 2015-208007 A | 11/2015 |
| WO | 2014/167755 A1 | 10/2014 |
| WO | 2015/099105 A1 | 7/2015 |
| WO | 2016/026607 A1 | 2/2016 |
| WO | 2017/138540 A1 | 8/2017 |
| WO | 2017170071 A1 | 10/2017 |

OTHER PUBLICATIONS

First Office Action in CN 201880064910.2, dated Jan. 19, 2023, 8 pages.

* cited by examiner freq(1930MHz to 1995MHz)

freq(1930MHz to 1995MHz)

freq(1930MHz to 1995MHz)

MULTIPLEXER AND HIGH-FREQUENCY FILTER

CROSS REFERENCE TO RELATED APPLICATIONS

This application claims the benefit of priority to Japanese Patent Application No. 2017-197048 filed on Oct. 10, 2017 and is a Continuation Application of PCT Application No. PCT/JP2018/037225 filed on Oct. 4, 2018. The entire contents of each application are hereby incorporated herein by reference.

BACKGROUND OF THE INVENTION

1. Field of the Invention

The present invention relates to a multiplexer and a high-frequency filter.

2. Description of the Related Art

In a communication apparatus such as a mobile phone terminal, there has been a demand for supporting carrier aggregation (CA) in which high-frequency signals in a plurality of frequency bands are transmitted and received at the same time with one terminal. In a communication apparatus employing such a method, for example, a multiport on switch (a switch including a plurality of switches and capable of turning on two or more of the plurality of switches at the same time) is connected to an antenna side of a plurality of filters, and high-frequency signals in a plurality of frequency bands are transmitted and received at the same time (see, for example, Japanese Unexamined Patent Application Publication No. 2015-208007).

For example, in a case where the high-frequency signals in the two frequency bands are transmitted and received at the same time, by improving reflection characteristics in an outside of the pass band of one filter among the plurality of filters, it is possible to improve bandpass characteristics of another filter which takes a frequency band outside the pass band as a pass band. This is because one input/output terminal of the plurality of filters is commonly connected by a common terminal (for example, a terminal on the antenna side), and the high-frequency signal corresponding to the pass band of the other filter is reflected without flowing into the one filter. However, when the multiport on switch is used, the switch is connected in series between the antenna and each of the plurality of filters, so that a loss occurs in the switch and the reflection characteristic of the one filter is deteriorated, and accordingly, the bandpass characteristic of the other filter is deteriorated along with this deterioration.

SUMMARY OF THE INVENTION

Preferred embodiments of the present invention provide multiplexers or the like that are each capable of improving filter characteristics.

A multiplexer according to a preferred embodiment of the present invention includes a plurality of filters, in which one input/output terminal of each of the plurality of filters is connected to a common terminal. A first filter included in the plurality of filters is a ladder filter, includes at least one series arm resonator connected on a path connecting the common terminal and another input/output terminal of the first filter, at least one parallel arm resonator connected between a connection node provided on the path and a ground, and a first switch which is connected in series with a first parallel arm resonator connected most nearby to the common terminal among the at least one parallel arm resonator, and switches between conduction and non-conduction of the connection node to which the first parallel arm resonator is connected and the ground.

According to this configuration, since the first switch is not connected on the path connecting the common terminal and the other input/output terminal of the first filter, deterioration of a filter characteristic of the first filter due to loss of the switch can be reduced or prevented. In addition, the first parallel arm resonator is a resonator which is closest to the common terminal among at least one parallel arm resonator defining the first filter and which is likely to affect impedance seen from the common terminal side of the first filter. In a case where the first switch is in a non-conductive state (the connection node to which the first parallel arm resonator is connected and the ground are in the non-conductive state), the first parallel arm resonator closest to the common terminal is opened. Therefore, the impedance seen from the common terminal side in an outside of the pass band of the first filter can be increased to an extent that the first parallel arm resonator is opened, and the reflection characteristic in the outside of the pass band of the first filter can be improved. In other words, it is possible to improve a bandpass characteristic of another filter which defines the multiplexer together with the first filter and takes a frequency band outside the pass band as a pass band. In this manner, a multiplexer capable of improving the filter characteristic can be provided.

In addition, the at least one series arm resonator is preferably at least two series arm resonators, and among the at least two series arm resonators, the first parallel arm resonator may be connected to the connection node between a first series arm resonator connected closest to the common terminal and a second series arm resonator connected second closest to the common terminal.

Since the first series arm resonator and the second series arm resonator are connected adjacent to the common terminal, these resonators are likely to affect impedance seen from the common terminal side of the first filter. In a case where the first switch is in a non-conductive state, the first parallel arm resonator connected between the first series arm resonator and the second series arm resonator is opened, so that combined capacitance of the first series arm resonator and the second series arm resonator becomes small. Therefore, the impedance seen from the common terminal side in the outside of the pass band of the first filter can be made larger, and the reflection characteristic of the first filter in the outside of the pass band can be further improved. That is, the bandpass characteristic of the other filter can be further improved.

In addition, the common terminal and the connection node to which the first parallel arm resonator is connected may be connected to each other without any of the at least one series arm resonator interposed therebetween.

According to this configuration, since the series arm resonator is not connected between the common terminal and the connection node to which the first parallel arm resonator is connected, the first filter is a ladder filter starting from a circuit in which the first parallel arm resonator and the first switch are connected in series seen from the common terminal side. In a case where the first switch is in the non-conductive state, the first parallel arm resonator is opened, and the first filter can be a ladder filter which starts from the series arm resonator seen from the common terminal side. On the other hand, in a case where the first switch is in the conductive state (the connection node to which the first parallel arm resonator is connected and the ground are in the conductive state), the first filter can be a ladder filter which starts from the first parallel arm resonator. In the ladder filter starting from the series arm resonator and the ladder circuit starting from the parallel arm resonator, the impedance seen from the common terminal side of the first filter is greatly different. Therefore, since the impedance seen from the common terminal side of the first filter can be greatly changed by conduction/non-conduction of the first switch, the first filter can also be used as an impedance adjustment circuit.

Also, the at least one parallel arm resonator is preferably at least two parallel arm resonators, the first filter preferably further includes a second switch, and the second switch is connected in series with a second parallel arm resonator connected closer to the other input/output terminal side than the first parallel arm resonator among the at least two parallel arm resonators, and may switch between conduction and non-conduction of the connection node to which the second parallel arm resonator is connected and the ground.

According to this configuration, it is possible to flexibly adjust the impedance seen from the common terminal side of the first filter by the first switch and the second switch.

Further, the second parallel arm resonator may be connected secondary adjacent to the common terminal among the at least two parallel arm resonators.

According to this configuration, since the second parallel arm resonator is located second closest to the common terminal among at least one parallel arm resonator defining the first filter and is likely to affect impedance seen from the common terminal side of the first filter, it is possible to adjust the impedance more flexibly.

Further, when any one of the plurality of filters excluding the first filter is used, the first switch may be made non-conductive.

According to this configuration, when any one of a plurality of filters excluding the first filter is used, the bandpass characteristic of the any one filter can be improved.

Further, the plurality of filters may include a filter having a pass band higher than the pass band of the first filter. Specifically, the first filter may be a filter having the lowest pass band among the plurality of filters.

When the first switch is in the conductive state, a Q value in the vicinity of a resonance point of the first parallel arm resonator deteriorates by the loss (for example, ON resistance) of the first switch. An anti-resonance point of the first parallel arm resonator defines a pass band of the first filter, and a resonance point lower in frequency than the anti-resonance point defines an attenuation band on a side lower than the pass band. Therefore, since the resonance point affects an attenuation characteristic of the attenuation band on the side lower than the pass band of the first filter, the attenuation characteristic of the attenuation band deteriorates due to deterioration of the Q value of the resonance point. In contrast, since the pass band of the first filter among a plurality of filters is as low as possible, for example, to the lowest pass band, it is possible to prevent the attenuation band on the side lower than the pass band of the first filter from overlapping with a pass band of another filter, thus reducing or preventing the influence on the other filter due to deterioration of the attenuation characteristic of the attenuation band.

In addition, the at least one parallel arm resonator may include a parallel arm resonator having a resonant frequency higher than a resonant frequency of the first parallel arm resonator. Specifically, the first parallel arm resonator may be a parallel arm resonator having the lowest resonant frequency among the at least one parallel arm resonator.

When the first switch is in the conductive state, a Q value in the vicinity of a resonance point of the first parallel arm resonator deteriorates by the loss (for example, ON resistance) of the first switch. Since the pass band of the filter is from the resonance point on the low frequency side of the parallel arm resonator to the anti-resonance point on the high frequency side, the resonant frequency of the first parallel arm resonator in which the Q value in the vicinity of the resonance point deteriorates is as low as possible, for example, to the lowest resonant frequency, so that the influence on the bandpass characteristic of the first filter due to the deterioration of the Q value can be reduced or prevented.

A high-frequency filter according to a preferred embodiment of the present invention is a ladder high-frequency filter, and includes at least one series arm resonator connected on a path connecting a first input/output terminal and a second input/output terminal, at least one parallel arm resonator connected between a connection node provided on the path and the ground, and a switch which is connected in series with any of the at least one parallel arm resonator and switches between conduction and non-conduction of the connection node to which the parallel arm resonator is connected and the ground.

According to this configuration, it is possible to provide a high-frequency filter capable of improving filter characteristics.

According to multiplexers or the like according to preferred embodiments of the present invention, filter characteristics can be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
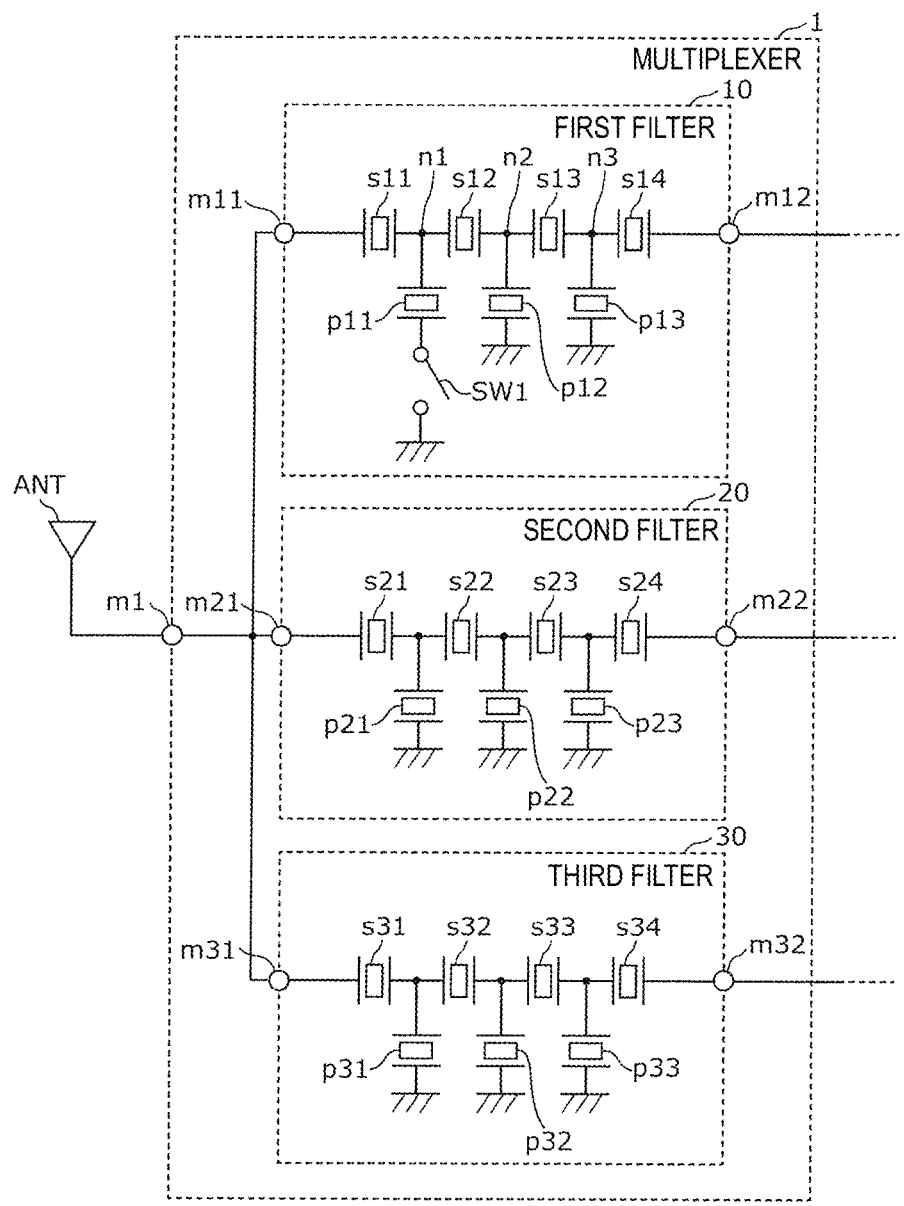
FIG. 1 is a circuit configuration diagram of a multiplexer according to a first preferred embodiment of the present invention.

Hereinafter, preferred embodiments of the present invention will be described in detail with reference to the drawings. Note that all preferred embodiments described below indicate comprehensive or specific examples. Numerical values, shapes, materials, elements, arrangements and connections of the elements, and the like, which will be described in the following preferred embodiments, are examples, and are not intended to limit the present invention. Elements which are not described in independent claims among the elements in the following preferred embodiments are described as arbitrary or optional elements. In addition, in the drawings, configurations that are the same or substantially the same are denoted by the same reference numerals, and redundant descriptions thereof may be omitted or simplified. In the following preferred embodiments, the term "being connected" includes not only a case of being directly connected but also a case of being electrically connected with another element or the like interposed therebetween.

First Preferred Embodiment

1. Configuration of Multiplexer

First a configuration of a multiplexer according to a first preferred embodiment of the present invention will be described.

FIG. 1 is a diagram illustrating a configuration of a multiplexer 1 according to the first preferred embodiment. Note that in FIG. 1, an antenna element ANT connected to a common terminal m1 of the multiplexer 1 is also illustrated. The antenna element ANT is preferably, for example, a multi-band compatible antenna that is compliant with a communication standard such as LTE (Long Term Evolution), which transmits and receives a high-frequency signal.

The multiplexer 1 includes a plurality of filters and is a demultiplexer/multiplexer in which one input/output terminal (input/output terminals m11, m21, and m31) of each of the plurality of filters is connected to the common terminal m1 in common. For example, a plurality of filters are different from one another in the pass band. In the present preferred embodiment, the multiplexer 1 is a triplexer including three filters. As illustrated in FIG. 1, the multiplexer 1 includes a first filter (which is preferably a ladder filter, for example), a second filter 20, and a third filter 30. Another input/output terminal (input/output terminals m12, m22, and m32) of each of the plurality of filters is connected to an RF signal processing circuit (RFIC: Radio Frequency Integrated Circuit) with, for example, amplifier circuits such as a switch circuit, a power amplifier, a low-noise amplifier, or the like interposed therebetween, although not illustrated in the figure. The first filter 10, the second filter 20, and the third filter 30 are selectively used to perform communication preferably by, for example, an RFIC. For example, CA is preferably performed by using two or more filters out of the first filter 10, the second filter 20, and the third filter 30 at the same time.

The first filter 10 is preferably, for example, a high-frequency filter taking a Band 66Rx (about 2110 MHz to about 2200 MHz) of LTE as a pass band. The first filter 10 is preferably, for example, a ladder acoustic wave filter.

The first filter 10 includes at least one series arm resonator connected on a path connecting one input/output terminal m11 (first input/output terminal) and another input/output terminal m12 (second input/output terminal). Since the input/output terminal m11 is connected to the common terminal m1, the path may be a path connecting the common terminal m1 and the input/output terminal m12. In the present preferred embodiment, the first filter 10 includes series arm resonators s11 to s14 which are connected in series to each other.

The first filter 10 includes at least one parallel arm resonator connected between a connection node provided on the path and a ground. The connection node is a connection point between an element and an element or between the element and a terminal, and is indicated by a dot expressed by n1 or the like in FIG. 1. In the present preferred embodiment, the first filter 10 includes, as at least one parallel arm resonator, a parallel arm resonator p11 connected between a node n1 between the series arm resonators s11 and s12 and the ground, a parallel arm resonator p12 connected between a node n2 between the series arm resonators s12 and s13 and the ground, and a parallel arm resonator p13 connected between a node n3 between the series arm resonators s13 and s14 and the ground.

The parallel arm resonator p11 is a first parallel arm resonator which is connected most nearby to the common terminal m1 among at least one parallel arm resonator (here, the parallel arm resonators p11 to p13). Since the parallel arm resonator p11 is connected most nearby to the common terminal m1 among the at least one parallel arm resonator configuring the first filter 10, the parallel arm resonator p11 is a resonator which is likely to affect impedance seen from the common terminal m1 side of the first filter 10. The term of being connected most nearby to the common terminal m1 means that the parallel arm resonator is connected most nearby to the common terminal m1 in the circuit diagram. That is, for example, in the arrangement on the substrate or the like, the parallel arm resonator p11 may not be arranged closest to the common terminal m1 among the parallel arm resonators p11 to p13.

At least one series arm resonator and at least one parallel arm resonator are resonators using acoustic waves, such as a resonator using a SAW (Surface Acoustic Wave), a resonator using a BAW (Bulk Acoustic Wave), a FBAR (Film Bulk Acoustic Resonator), or the like, for example. The SAW includes not only a surface acoustic wave but also a boundary acoustic wave. Here, these resonators are referred to as SAW resonators. Accordingly, since the high-frequency filter can be defined by an IDT (InterDigital Transducer) electrode on a substrate having piezoelectricity, a small-sized and low-height filter circuit having a bandpass characteristic with a high steepness can be provided. The substrate having the piezoelectricity is a substrate having the piezoelectricity at least on its surface. The substrate may preferably include, for example, a piezoelectric thin film on a surface thereof, and may be a multilayer body including such as a film having a different acoustic velocity from that of the piezoelectric thin film, a support substrate, and the like. The substrate may also be, for example, a multilayer body including a high acoustic velocity support substrate, and a piezoelectric thin film formed on the high acoustic velocity support substrate, a multilayer body including a high acoustic velocity support substrate, a low acoustic velocity film formed on the high acoustic velocity support substrate, and a piezoelectric thin film formed on the low acoustic velocity film, or a multilayer body including a support substrate, a high acoustic velocity film on the support substrate, a low acoustic velocity film on the high acoustic velocity film, and a piezoelectric thin film on the low acoustic velocity film. Note that the substrate may have a piezoelectricity on the entire substrate. Since the same applies to the resonators described below, the detailed description thereof will be omitted.

The first filter 10 includes a switch SW1 (first switch). The switch SW1 is connected in series with the parallel arm resonator p11, and is a switch for switching between conduction and non-conduction of the node n1 to which the parallel arm resonator p11 is connected and the ground. The term "non-conduction" means not only a case of being completely non-conductive but also a case where a fine current flows, such as a leakage current. Note that the switch SW1 is connected between the parallel arm resonator p11 and the ground, but may also be connected between the node n1 and the parallel arm resonator p11. The switch SW1 is preferably, for example, an SPST (Single Pole Single Throw) type switching element. The switch SW1 switches between conduction and non-conduction by a control signal from a controller (not illustrated) such as an RFIC or the like, thus making the connection node and the ground conductive or non-conductive. For example, the switch SW1 may preferably be an FET (Field Effect Transistor) switch made of GaAs or CMOS (Complementary Metal Oxide Semiconductor), or a diode switch. Note that since the switches described below are also the same as those described above, detailed description thereof will be omitted below.

Since the switch SW1 is not connected on the path connecting the common terminal m1 and the input/output terminal m12, the switch SW1 hardly affects the filter characteristic of the first filter 10. For example, when the switch is connected on the path, when the first filter 10 is used, the switch is made to be in a conductive state. At this time, the bandpass characteristic and reflection characteristic of the first filter 10 deteriorate by the loss (ON resistance) of the switch. Therefore, when the first filter 10 and another filter are used simultaneously, the reflection characteristic of the first filter 10 deteriorates, so that the bandpass characteristic of the other filter also deteriorates. Therefore, in preferred embodiments of the present invention, the switch is not connected on the path, and is connected in series with the parallel arm resonator.

When the switch SW1 is in the non-conductive state, that is, when the node n1 to which the parallel arm resonator p11 is connected and the ground are in the non-conductive state, the parallel arm resonator p11 closest to the common terminal m1 is opened. In the present preferred embodiment, at least two series arm resonators are provided, and the parallel arm resonator p11 is connected to the node n1 between the series arm resonator s11 (first series arm resonator) connected most nearby to the common terminal m1 and the series arm resonator s12 (second series arm resonator) connected secondary nearby to the common terminal m1 among the at least two series arm resonators. Accordingly, when the switch SW1 is in the non-conductive state, combined capacitance of the two series arm resonators s11 and s12 connected in series is reduced.

When the first filter 10 is used, for example, the switch SW1 is made conductive. On the other hand, when any one (second filter 20 or third filter 30) of the plurality of filters except the first filter 10 is used, the switch SW1 is made non-conductive. In this case, only the second filter 20 may be used, only the third filter 30 may be used, both the second filter 20 and the third filter 30 may be used, and CA may be performed. When the second filter 20 or the third filter 30 is used, in a case where the first filter 10 is also used (for example, at three CA in which the first filter 10, the second filter 20, and the third filter 30 are simultaneously used), the switch SW1 may be made non-conductive.

The number of series arm resonators included in the first filter 10 is not limited to four, and the number of parallel arm resonators is not limited to three. For example, the first filter 10 may include one to three or more than five series arm resonators, and may include one, two, or more than four parallel arm resonators. For example, the first filter 10 may include one series arm resonator s11, one parallel arm resonator p11, and the switch SW1.

The second filter 20 is preferably, for example, a filter having a Band 25Rx (about 1930 MHz to about 1995 MHz) of LTE as a pass band. The second filter 20 is preferably, for example, a ladder acoustic wave filter. The second filter 20 includes series arm resonators s21 to s24 connected on a path connecting one input/output terminal m21 (common terminal m1) and another input/output terminal m22. The second filter 20 also includes a parallel arm resonator p21 connected between a node between the series arm resonators s21 and s22 and the ground, a parallel arm resonator p22 connected between a node between the series arm resonators s22 and s23 and the ground, and a parallel arm resonator p23 connected between a node between the series arm resonators s23 and s24 and the ground.

The third filter 30 is preferably, for example, a filter having a Band 30Rx (about 2350 MHz to about 2360 MHz) of LTE as a pass band. The third filter 30 is preferably, for example, a ladder acoustic wave filter. The third filter 30 includes series arm resonators s31 to s34 connected on a path connecting one input/output terminal m31 (common terminal m1) and another input/output terminal m32. The third filter 30 also includes a parallel arm resonator p31 connected between a node between the series arm resonators s31 and s32 and the ground, a parallel arm resonator p32 connected between a node between the series arm resonators s32 and s33 and the ground, and a parallel arm resonator p33 connected between a node between the series arm resonators s33 and s34 and the ground.

2. Characteristics of Multiplexer

Next, characteristics of the multiplexer 1 will be described in detail.

Figure 2A:
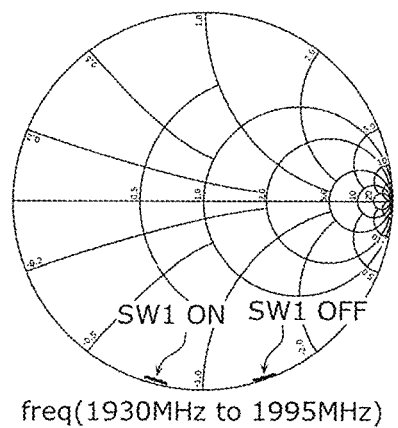
FIG. 2A is a Smith chart illustrating an impedance characteristic of a first filter in a case a first switch being non-conductive and being conductive in the first preferred embodiment of the present invention.
Figure 2B:
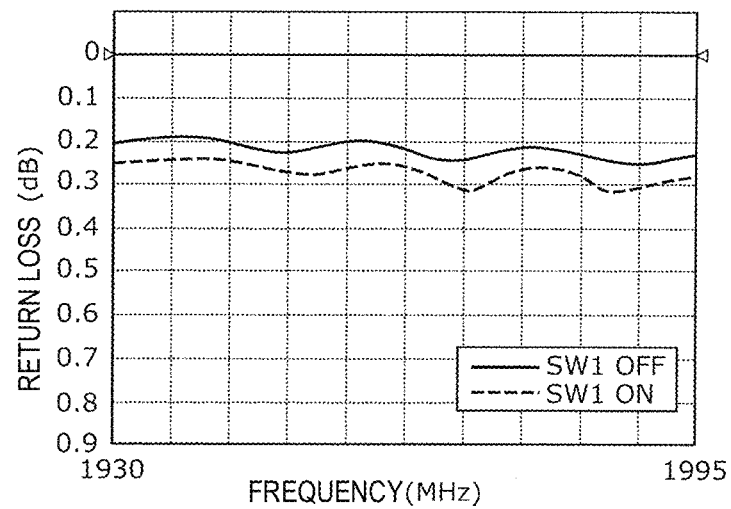
FIG. 2B is a graph illustrating a return loss of the first filter in a case the first switch being non-conductive and being conductive in the first preferred embodiment of the present invention.

FIG. 2A is a Smith chart illustrating an impedance characteristic of the first filter 10 in a case the switch SW1 being non-conductive (OFF) and being conductive (ON) in the first preferred embodiment. Specifically, FIG. 2A is a Smith chart illustrating the impedance characteristic of the first filter 10 when seen from the input/output terminal m11 side of the common terminal m1 side of the first filter 10. Note that in order to explain the impedance characteristic of the first filter 10 when not being affected by the second filter 20 and the third filter 30, in FIG. 2A, the second filter 20 and the third filter 30 are separated from the first filter 10. That is, in FIG. 2A, the connection state of the first filter 10, the second filter 20, and the third filter 30 is not an actual use state (the state illustrated in FIG. 1) for the purpose of explanation. FIG. 2B is a graph illustrating a return loss of the first filter 10 in the case the switch SW1 being non-conductive and being conductive in the first preferred embodiment. In order to explain the return loss of the first filter 10 when not being affected by the second filter 20 and the third filter 30, in FIG. 2B, the second filter 20 and the third filter 30 are separated from the first filter 10. In other words, in FIG. 2B, the connection states of the first filter 10, the second filter 20, and the third filter 30 are not an actual use state for explanation. In FIG. 2B, a solid line indicates a return loss of the first filter 10 in a case where the switch SW1 is non-conductive, and a broken line indicates a return loss of the first filter 10 in a case where the switch SW1 is conductive. Each figure illustrates the filter characteristic of the first filter 10 in an outside of the pass band (2110 to 2200 MHz) of the first filter 10 and in the pass band (1930 to 1995 MHz) of the second filter 20. In the figures described below, the same applies to a case when it is not specifically explained.

As is apparent from FIG. 2A, when comparing the case where the switch SW1 is conductive with the case where the switch SW1 is non-conductive, the impedance seen from the common terminal m1 side is larger in the outside of the pass band of the first filter 10 (specifically, in the pass band of the second filter 20: about 1930 MHz to about 1995 MHz) by making the switch SW1 non-conductive. As described above, the parallel arm resonator p11 is a resonator which is connected most nearby to the common terminal m1 among at least one parallel arm resonator configuring the first filter 10 and therefore is likely to affect the impedance seen from the common terminal m1 side of the first filter 10. That is, the impedance can be made large by connecting the switch SW1 in series with the parallel arm resonator p11 and making the switch SW1 non-conductive and the parallel arm resonator p11 be open.

Further, the series arm resonators s11 and s12 are connected nearby to the common terminal m1 because there is the node n1 to which the parallel arm resonator p11 is connected between the series arm resonators s11 and s12, and thus are a resonator likely to affect the impedance seen from the common terminal side of the first filter 10. Therefore, when the parallel arm resonator p11 is opened, the combined capacitance of the series arm resonators s11 and s12 becomes small (impedance becomes large), which is a factor that can increase the impedance seen from the common terminal m1 side.

As a result, as illustrated in FIG. 2B, in a case where the switch SW1 is non-conductive, the return loss in the outside of the pass band of the first filter 10 (the pass band of the second filter 20) is reduced, and the high-frequency signal corresponding to the pass band of the second filter 20 is easily reflected in the first filter 10, thus improving an insertion loss in the pass band of the second filter 20.

Figure 3:
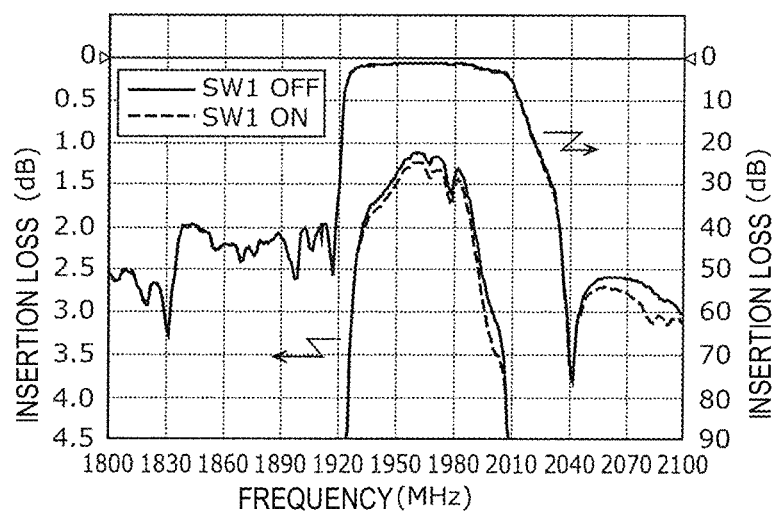
FIG. 3 is a graph illustrating an insertion loss of a second filter in the case the first switch being non-conductive and being conductive in the first preferred embodiment of the present invention.

FIG. 3 is a graph illustrating an insertion loss of the second filter 20 in the case the switch SW1 being non-conductive and being conductive in the first preferred embodiment. In FIG. 3, the connection state of the first filter 10, the second filter 20, and the third filter 30 is in the actual use state. In FIG. 3, a solid line indicates an insertion loss of the second filter 20 in the case where the switch SW1 is non-conductive, and a broken line indicates insertion loss of the second filter 20 in the case where the switch SW1 is conductive. FIG. 3 illustrates the bandpass characteristic of the second filter 20 in the pass band (1930 to 1995 MHz) of the second filter 20 outside the pass band (2110 to 2200 MHz) of the first filter 10.

As illustrated in FIG. 3, it is understood that in the case where the switch SW1 is non-conductive, the insertion loss in the pass band of the second filter 20 is reduced, and the bandpass characteristic of the second filter 20 is improved. Specifically, the insertion loss of the second filter 20 is about 2.349 dB at about 1930 MHz and about 2.853 dB at about 1995 MHz in the case where the switch SW1 is conductive, whereas about 2.28 dB at about 1930 MHz and about 2.552 dB at about 1995 MHz in the case where the switch SW1 is non-conductive, such that the insertion loss is improved.

As described above, the parallel arm resonator p11 is a resonator which is likely to affect the impedance seen from the common terminal m1 side of the first filter 10, and in order to make the parallel arm resonator p11 be open, the switch SW1 is connected in series with the parallel arm resonator p11. In the following, a comparative example in which the switch SW1 is not connected in series with the parallel arm resonator p11 will be described.

Figure 4:
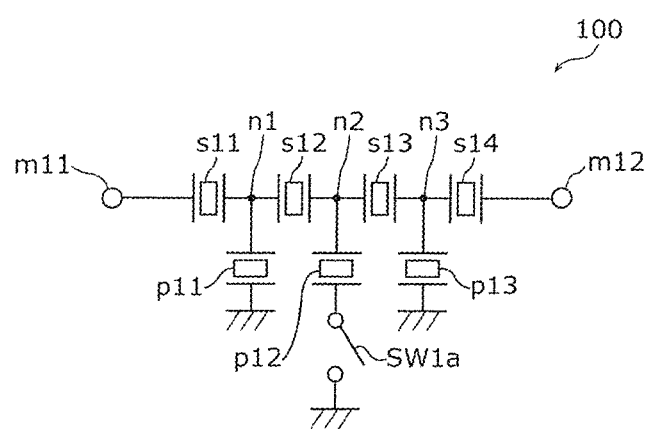
FIG. 4 is a circuit configuration diagram of a first filter according to a comparative example.

FIG. 4 is a circuit configuration diagram of a first filter 100 according to the comparative example. Although not illustrated in the figure, the first filter 100, the second filter 20, and the third filter 30 define a multiplexer as illustrated in FIG. 1.

As illustrated in FIG. 4, in the comparative example, the switch SW1 is not connected to the parallel arm resonator p11, and a switch SW1a is connected to the parallel arm resonator p12. Since not being a resonator which is connected most nearby to the common terminal m1 among at least one parallel arm resonator configuring the first filter 100, the parallel arm resonator p12 is a resonator which hardly affects impedance seen from the common terminal m1 side of the first filter 100 than the parallel arm resonator p11.

Figure 5:
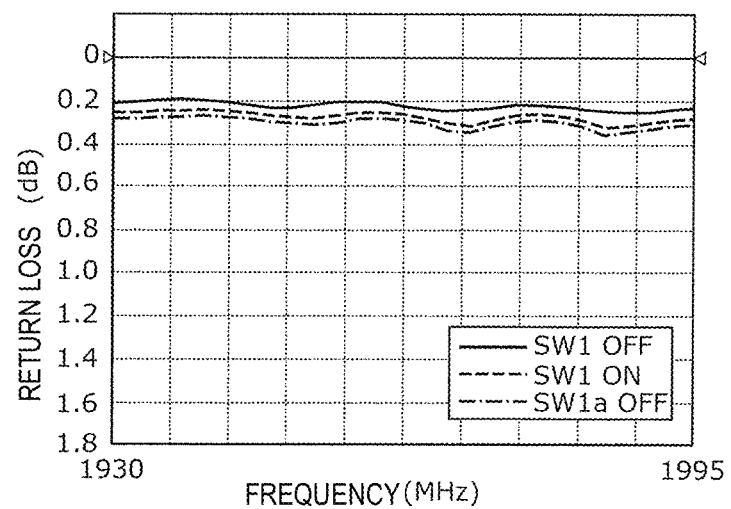
FIG. 5 is a graph illustrating the return loss of the first filter when comparing the first preferred embodiment of the present invention with the comparative example.

FIG. 5 is a graph illustrating a return loss of the first filters 10 and 100 when comparing the first preferred embodiment with the comparative example. Note that in order to explain the return loss of the first filter 100 when not being affected by the second filter 20 and the third filter 30, in FIG. 5, the second filter 20 and the third filter 30 are separated from the first filter 100. In other words, in FIG. 5, a connection state of the first filter 100, the second filter 20, and the third filter 30 is not an actual use state for the purpose of explanation. In FIG. 5, a solid line indicates the return loss of the first filter 10 in the case where the switch SW1 is non-conductive, a broken line indicates the return loss of the first filter 10 in the case where the switch SW1 is conductive, and a dashed-dotted line indicates a return loss of the first filter 100 in a case where the switch SW1a is non-conductive.

As illustrated in FIG. 5, it is understood that in the case where the switch SW1a is made non-conductive in the first filter 100, the return loss is larger than that in the case where the switch SW1 is made non-conductive in the first filter 10. As described above, the parallel arm resonator p12 is a resonator which hardly affects impedance seen from the common terminal m1 side of the first filter 100, rather than the parallel arm resonator p11. Therefore, as in the present preferred embodiment, by connecting the switch SW1 in series with the parallel arm resonator p11 which is connected most nearby to the common terminal m1 among at least one parallel arm resonator configuring the first filter 10, the impedance seen from the common terminal m1 side of the filter 100 can be improved.

Variation

The multiplexer 1 may include a matching circuit between the common terminal m1 and one input/output terminals m11, m21, and m31 of respective filters.

Figure 6:
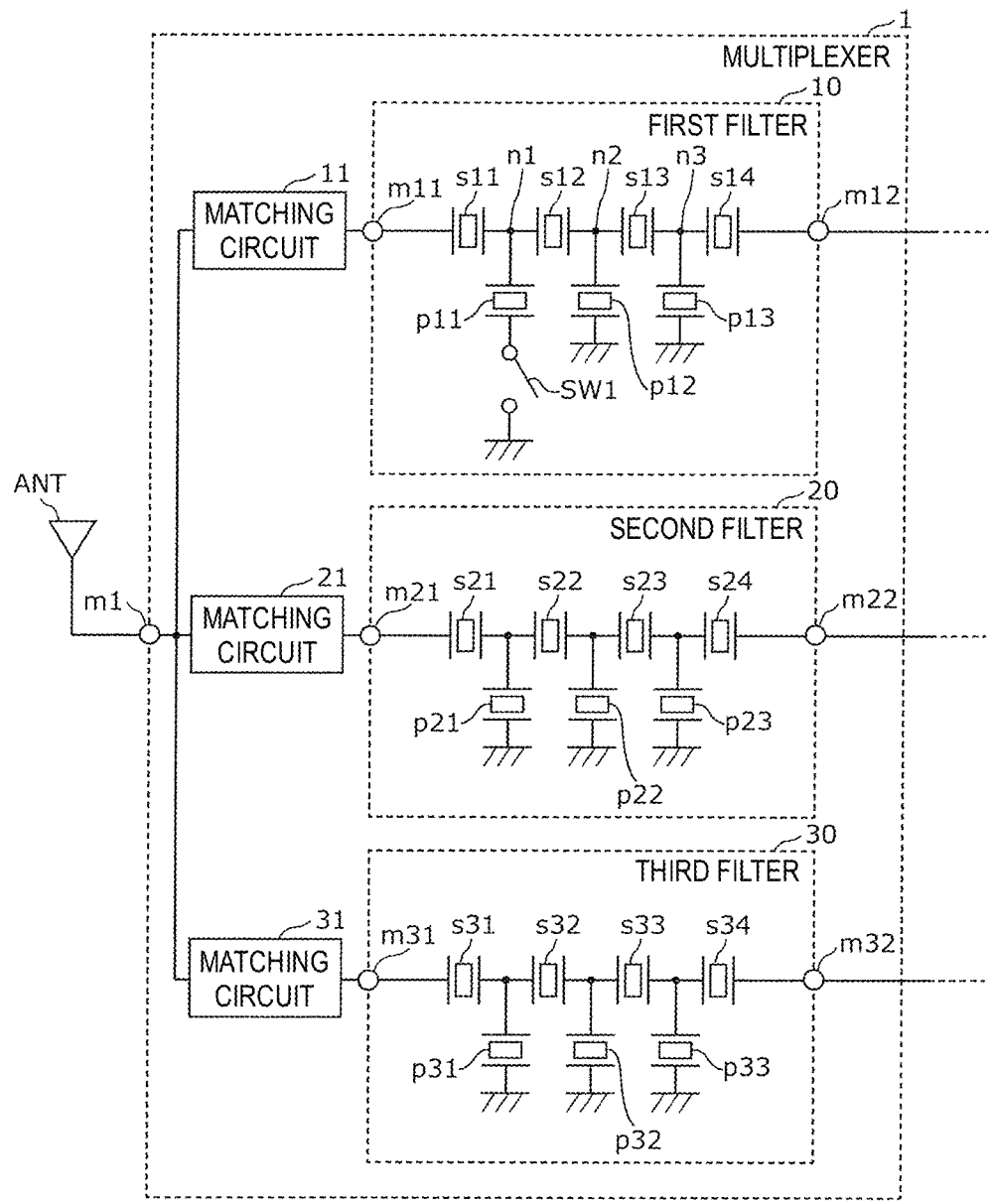
FIG. 6 is a circuit configuration diagram of a multiplexer according to a variation of the first preferred embodiment of the present invention.

FIG. 6 is a circuit configuration diagram of the multiplexer 1 according to a variation of the first preferred embodiment.

The multiplexer 1 according to the variation of the present preferred embodiment includes a matching circuit 11 that adjusts impedance of the first filter 10 between the common terminal m1 and the input/output terminal m11, includes a matching circuit 21 that adjusts impedance of the second filter 20 between the common terminal m1 and the input/output terminal m21, and includes a matching circuit 31 that adjusts impedance of the third filter 30 between the common terminal m1 and the input/output terminal m31. The matching circuits 11, 21, and 31 are preferably, for example, LC circuits or the like, but are not particularly limited thereto. However, when the switch is connected in series on the path connecting the common terminal m1 and the input/output terminals m11, m21, and m31, the filter characteristics of the filters deteriorate due to the loss caused by the switch, so that the matching circuits 11, 21, and 31 do not include the switches. In the variation of the present preferred embodiment, the matching circuits 11, 21, and 31 are preferably defined by, for example, shunt inductors.

Figure 7A:
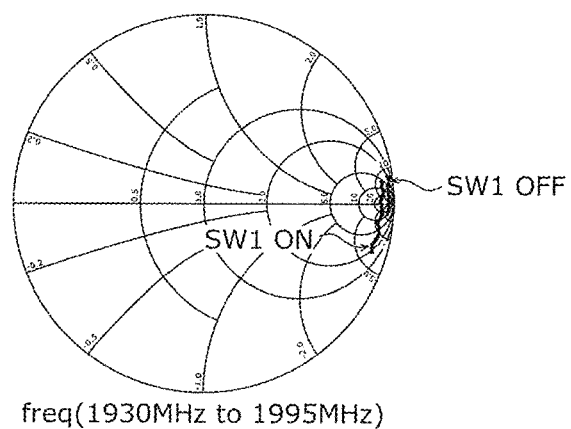
FIG. 7A is a Smith chart illustrating an impedance characteristic of the first filter in a case a first switch being non-conductive and being conductive in the variation of the first preferred embodiment of the present invention.
Figure 7B:
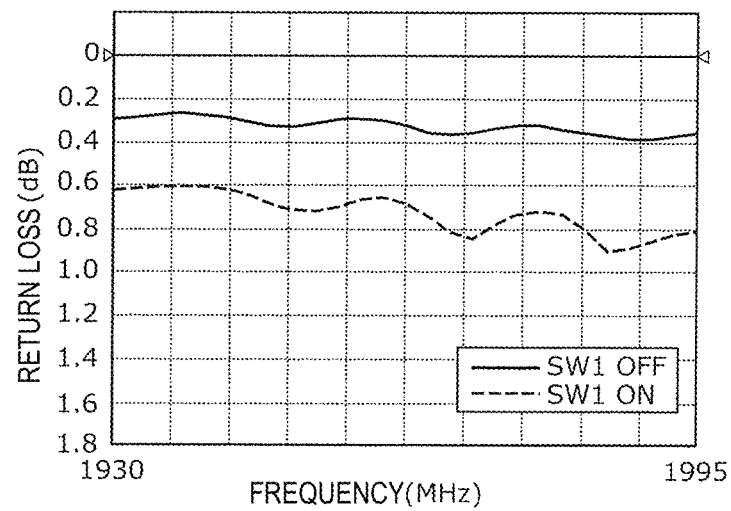
FIG. 7B is a graph illustrating a return loss of the first filter in the case the first switch being non-conductive and being conductive in the variation of the first preferred embodiment of the present invention.

FIG. 7A is a Smith chart illustrating an impedance characteristic of the first filter 10 in a case the switch SW1 being non-conductive and being conductive in the variation of the first preferred embodiment. FIG. 7B is a graph illustrating a return loss of the first filter 10 in the case the switch SW1 being non-conductive and being conductive in the variation of the first preferred embodiment. As in FIGS. 2A and 2B, in FIGS. 7A and 7B, the second filter 20 and the third filter 30 are separated from the first filter 10.

As illustrated in FIG. 7A, it is understood that the impedance characteristic of the first filter 10 on the Smith chart in this variation is at a position where a constant resistance circuit is rotated counterclockwise and has an increase in impedance (in particular, reactance) as compared with the impedance characteristic illustrated in FIG. 2A in any of the case where the switch SW1 is conductive and the case of being non-conductive. This is because the shunt inductor is connected as the matching circuit 11 between the common terminal m1 and the first filter 10.

Further, as illustrated in FIG. 7B, it is understood that even when the matching circuit 11 is connected, in the case where the switch SW1 is non-conductive, the reflection characteristic of the first filter 10 can be improved as compared with the case of being conductive.

In this way, the matching circuit 11 may be connected between the common terminal m1 and the first filter 10, so that the impedance seen from the common terminal m1 may be increased in the outside of the pass band of the first filter 10.

As described above, since the switch SW1 is connected between the path connecting the common terminal m1 and the input/output terminal m12 and the ground, and is not connected on the path, deterioration of the filter characteristic of the first filter 10 due to loss of the switch can be reduced or prevented. In addition, the parallel arm resonator p11 is a resonator which is closest to the common terminal m1 among at least one parallel arm resonator configuring the first filter 10 and which is likely to affect impedance seen from the common terminal m1 side of the first filter 10. In a case where the switch SW1 is in the non-conductive state, the parallel arm resonator p11 closest to the common terminal m1 is opened. Therefore, the impedance seen from the common terminal m1 side in the outside of the pass band of the first filter 10 can be increased, and the reflection characteristic in the outside of the pass band of the first filter 10 can be improved. In other words, it is possible to improve the bandpass characteristic of another filter (second filter 20 or the like) which defines the multiplexer 1 together with the first filter 10 and takes a frequency band outside the pass band as a pass band.

Preferred embodiments of the present invention are particularly effective in a case where a filter having low priority and a filter having high priority are included in a plurality of filters which can be simultaneously used in a multiplexer. The filter having high priority is, for example, a filter corresponding to a frequency band used frequently, or a filter having a strict demand specification. For example, in the present preferred embodiment, in the first filter 10, since the switch SW1 is made non-conductive, the parallel arm resonator p11 becomes open, so that the filter characteristic of the first filter 10 deteriorates when the switch SW1 is in the non-conductive state. Therefore, the first filter 10 may be used as a filter having low priority. On the other hand, since the filter characteristic is improved by the first filter 10, the second filter 20 may be used as a filter having higher priority than that of the first filter 10.

Further, since between the two series arm resonators s11 and s12, there is the node n1 to which the parallel arm resonator p11 is connected, the two series arm resonators s11 and s12 are also connected nearby to the common terminal m1, these resonators are a resonator which is likely to affect impedance seen from the common terminal side of the first filter 10. In a case where the switch SW1 is in the non-conductive state, the parallel arm resonator p11 connected between the two series arm resonators s11 and s12 is opened, so that the combined capacitance of the two series arm resonators s11 and s12 becomes small. Therefore, the impedance seen from the common terminal m1 side in the outside of the pass band of the first filter 10 can be made larger, and the reflection characteristic in the outside of the pass band of the first filter 10 can be further improved. That is, the bandpass characteristic of the other filter (the second filter 20 or the like) can be further improved.

Note that a filter having a higher pass band than the first filter 10 may be included in the plurality of filters configuring the multiplexer 1, and for example, the first filter 10 may be a filter having the lowest pass band among a plurality of filters.

In a case where the switch SW1 is in the conductive state, a Q value of the resonance point (the singular point where the impedance of the resonator becomes the minimum (ideally, the point where the impedance becomes 0)) of the parallel arm resonator p11 is deteriorated due to the loss (for example, ON resistance) of the switch SW1. An anti-resonance point of the parallel arm resonator p11 (a singular point where the impedance of a resonator becomes the maximum (ideally a point where the impedance becomes infinite) forms the pass band of the first filter 10, and a resonance point lower in frequency than the anti-resonance point forms an attenuation band on the lower side than the pass band. Therefore, since the resonance point affects the attenuation characteristic of the attenuation band on the side lower than the pass band of the first filter 10, the attenuation characteristic of the attenuation band deteriorates due to the deterioration of the Q value of the resonance point. In contrast, since the pass band of the first filter 10 among a plurality of filters is as low as possible, for example, the lowest pass band, it is possible to prevent the attenuation band on the side lower than the pass band of the first filter 10 from overlapping with a pass band of another filter (for example, third filter 30), thus reducing or preventing the influence on the other filter due to deterioration of the attenuation characteristic of the attenuation band.

In addition, at least one parallel arm resonator may include a parallel arm resonator having a resonant frequency higher than the resonant frequency of the parallel arm resonator p11, and for example, the parallel arm resonator p11 may be a parallel arm resonator having the lowest resonant frequency among at least one parallel arm resonator.

In a case where the switch SW1 is in the conductive state, a Q value in the vicinity of a resonance point of the parallel arm resonator p11 deteriorates by the loss (for example, ON resistance) of the switch SW1. Since the pass band of the filter is from the resonance point on the low frequency side of the parallel arm resonator to the anti-resonance point on the high frequency side, the resonance frequency of the parallel arm resonator p11 in which the Q value in the vicinity of the resonance point deteriorates is as low as possible, for example, the lowest resonant frequency, so that the influence on the bandpass characteristic of the first filter 10 due to the deterioration of the Q value can be reduced or prevented.

Second Preferred Embodiment

Next, a first filter 10a according to a second preferred embodiment of the present invention will be described.

The first filter 10a according to the second preferred embodiment is different from the first filter 10 according to the first preferred embodiment in that the series arm resonator s11 is not included. Since the other points are the same or substantially the same as those of the first filter 10 according to the first preferred embodiment, a description thereof will not be repeated. Although not illustrated in the figure, in the second preferred embodiment, the first filter 10a preferably defines a multiplexer together with the second filter 20 and the third filter 30. The pass band of the first filter 10a is preferably set to, for example, the Band 66Rx (about 2110 MHz to about 2200 MHz) of LTE which is the same as that of the first filter 10.

Figure 8:
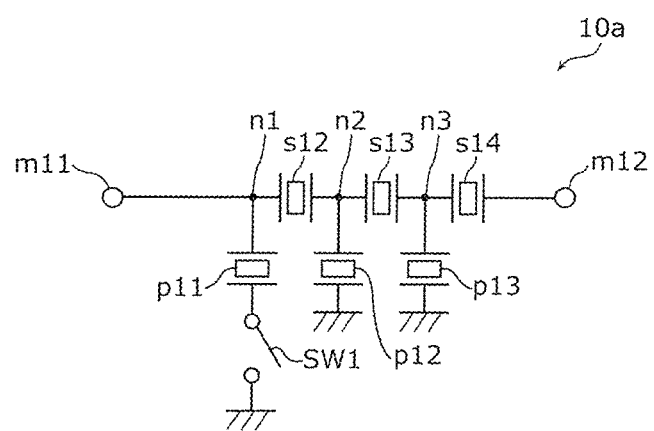
FIG. 8 is a circuit configuration diagram of a first filter according to a second preferred embodiment of the present invention.

FIG. 8 is a circuit configuration diagram of the first filter 10a according to the second preferred embodiment.

Since the first filter 10a according to the second preferred embodiment does not include the series arm resonator s11 as compared with the first filter 10 according to the first preferred embodiment, the common terminal m1 (input/output terminal m11) and the node n1 to which the parallel arm resonator p11 is connected are connected without any of at least one series arm resonator interposed therebetween. Thus, the node n1 becomes a connection node provided between the common terminal m1 (input/output terminal m11) and the series arm resonator s12. Therefore, since the series arm resonator is not connected to the common terminal m1 side of the node n1, the first filter 10a is a ladder filter starting from a circuit in which the parallel arm resonator p11 and the switch SW1 are connected in series seen from the common terminal m1 side.

Figure 9:
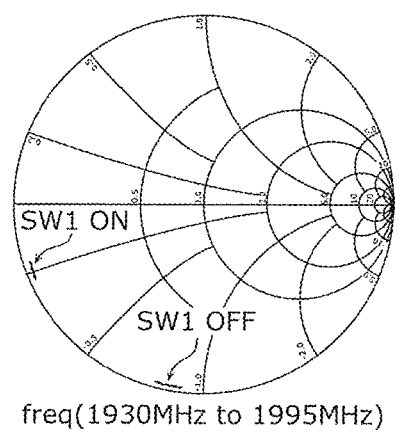
FIG. 9 is a Smith chart illustrating an impedance characteristic of the first filter in a case a first switch being non-conductive and being conductive in the second preferred embodiment of the present invention.

FIG. 9 is a Smith chart illustrating an impedance characteristic of the first filter 10a in the case where the switch SW1 is non-conductive and the case of being conductive in the second preferred embodiment. As in FIG. 2A, in FIG. 9, the second filter 20 and the third filter 30 are separated from the first filter 10a.

As is apparent from FIG. 9, when comparing the case where the switch SW1 is conductive with the case of where the switch SW1 is non-conductive, the impedance seen from the common terminal m1 side is larger in an outside of the pass band of the first filter 10a (specifically, in the pass band of the second filter 20: about 1930 MHz to about 1995 MHz) by making the switch SW1 non-conductive. However, it is understood that the impedance characteristic of the first filter 10a on the Smith chart in the present preferred embodiment is at a position where a constant resistance circuit is rotated clockwise as compared with the impedance characteristic of the first filter 10 illustrated in FIG. 2A and the impedance (in particular, reactance) is small. This is because, in the first preferred embodiment, the inductance is increased by decrease in the combined capacitance of the series arm resonators s11 and s12, but in the second preferred embodiment, the first filter 10a does not include the series arm resonator s11, by the extent thereof the capacitance becomes large (i.e., the impedance is small).

However, in the present preferred embodiment, in the case where the switch SW1 is in the non-conductive state, the parallel arm resonator p11 is opened, and the first filter 10a can be provided as a ladder filter that starts from the series arm resonator s12 as seen from the common terminal m1 side. On the other hand, in the case where the switch SW1 is in the conductive state, the first filter 10a can be provided as a ladder filter which starts from the parallel arm resonator p1. Thus, the impedance characteristic of the first filter 10a on the Smith chart in the present preferred embodiment is such that a change amount in the impedance is large in the case the switch SW1 being conductive and being non-conductive as compared with the impedance characteristic of the first filter 10 illustrated in FIG. 2A. In this manner, in the ladder filter starting from the series arm resonator s12 and the ladder filter starting from the parallel arm resonator p11, the impedance seen from the common terminal m1 side of the first filter 10 is greatly different. Therefore, since the impedance seen from the common terminal m1 side of the first filter 10a can be greatly changed by conduction and non-conduction of the switch SW1, the first filter 10a can also be used as an impedance adjustment circuit.

Third Preferred Embodiment

Next, a first filter 10b according to a third preferred embodiment of the present invention will be described.

The first filter 10b according to the third preferred embodiment is different from the first filter 10 according to the first preferred embodiment in that at least two parallel arm resonators are included, and that a switch is connected in series with a parallel arm resonator other than the parallel arm resonator p11 among the at least two parallel arm resonators. Although the first filter 10b according to the third preferred embodiment is also different from the first filter 10 according to the first preferred embodiment in that a parallel arm resonator p14 and the series arm resonator s15 are included, the different points emphasize that the number of series connection of the series arm resonators and the number of parallel connection of the parallel arm resonators may be different from those of the first preferred embodiment, and are not a main feature of the third preferred embodiment, therefore the detailed description thereof is omitted. Although not illustrated in FIG. 10, in the third preferred embodiment, the first filter 10b configures a multiplexer together with the second filter 20 and the third filter 30. Further, the pass band of the first filter 10b is preferably set to, for example, the Band 66Rx (about 2110 MHz to about 2200 MHz) of LTE the same as the first filter 10.

Figure 10:
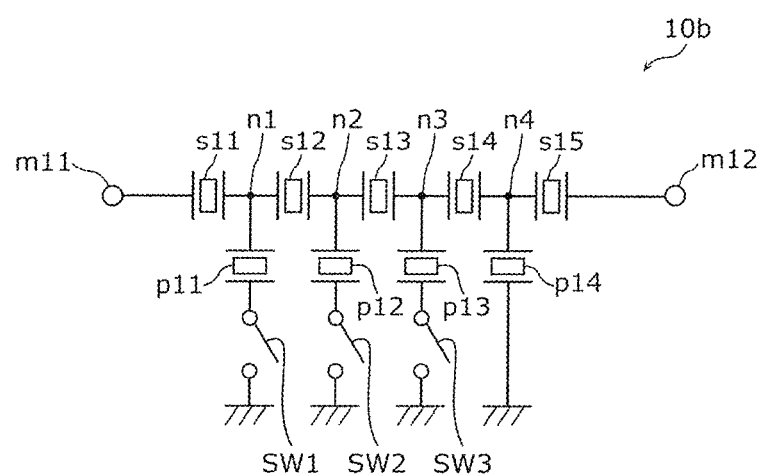
FIG. 10 is a circuit configuration diagram of a first filter according to a third preferred embodiment of the present invention.

FIG. 10 is a circuit configuration diagram of the first filter 10b according to the third preferred embodiment.

The first filter 10b further includes a switch SW2 (second switch). The switch SW2 is connected in series with the parallel arm resonator p12 (second parallel arm resonator) connected closer to the other input/output terminal m12 side than the parallel arm resonator p11 among at least two parallel arm resonators, and switches between conduction and non-conduction of the node n2 to which the parallel arm resonator p12 is connected and a ground. In addition, any of at least one series arm resonator (here, the series arm resonator s12) is connected between the node n1 to which the parallel arm resonator p11 is connected and the node n2 to which the parallel arm resonator p12 is connected. As illustrated in FIG. 10, among at least two parallel arm resonators, the parallel arm resonator p12 is connected secondary nearby to the common terminal m1 (input/output terminal m11). Note that the first filter 10b may not include the series arm resonator s12, and any of the at least one series arm resonator may not be connected between the node n1 and the node n2.

Further, the first filter 10b includes a switch SW3 (third switch). The switch SW3 is connected in series with a parallel arm resonator p13 connected closer to the other input/output terminal m12 side than the parallel arm resonator p11 among at least two parallel arm resonators, and switches between conduction and non-conduction of the node n3 to which the parallel arm resonator p13 is connected and the ground. In addition, any of at least one series arm resonator (here, the series arm resonator s13) is connected between the node n2 to which the parallel arm resonator p12 is connected and the node n3 to which the parallel arm resonator p13 is connected. As illustrated in FIG. 10, the parallel arm resonator p13 is connected thirdly nearby to the common terminal m1 (input/output terminal m11) among at least two parallel arm resonators. Note that the first filter 10b may not include the series arm resonator s13, and any of the at least one series arm resonator may not be connected between the node n2 and the node n3.

In this manner, in the present preferred embodiment, in addition to the parallel arm resonator p11 which is connected most nearby to the common terminal m1, a switch is connected in series to also the parallel arm resonator connected closer to the input/output terminal m12 side than the parallel arm resonator p11. Note that the first filter 10b may not include any of the switches SW2 and SW3, and a switch may be connected in series with the parallel arm resonator p14.

Figure 11:
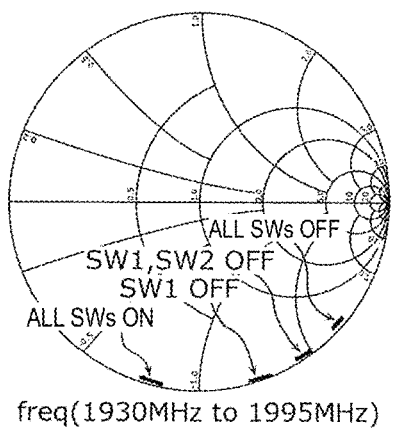
FIG. 11 is a Smith chart illustrating an impedance characteristic of the first filter when switching between non-conduction and conduction of a first switch to a third switch in the third preferred embodiment of the present invention.

FIG. 11 is a Smith chart illustrating an impedance characteristic of the first filter 10b when switching between non-conduction and conduction of the switch SW1 to the switch SW3 in the third preferred embodiment. Note that in the same or similar manner as FIG. 2A, in FIG. 11, the second filter 20 and the third filter 30 are separated from the first filter 10b. The "all SWs ON" illustrated in FIG. 11 indicates the impedance characteristic of the first filter 10b in a case where all the switches SW1 to SW3 are made conductive. The "SW1 OFF" indicates the impedance characteristic of the first filter 10b in a case where only the switch SW1 is in the non-conductive state and the switches SW2 and SW3 are in the conductive state. The "SW1, SW2 OFF" indicates the impedance characteristic of the first filter 10b in a case where the switches SW1 and SW2 are in the non-conductive state and only the switch SW3 is in the conductive state. The "all SWs OFF" indicates the impedance characteristic of the first filter 10b in a case where all the switches SW1 to SW3 are in the non-conductive state.

As illustrated in FIG. 11, it is understood that when all the switches SW1 to SW3 are conductive, from a switch corresponding to the parallel arm resonator connected nearby to the common terminal m1, each of the switches is made non-conductive in the order (i.e. in the order of the switches SW1, SW2, and SW3), the impedance is gradually increased.

As described above, by connecting a switch also to the parallel arm resonator other than the parallel arm resonator p11 which is connected most nearby to the common terminal m1 as a switch to be connected to the parallel arm resonator, it is possible to flexibly adjust the impedance seen from the common terminal m1 side of the first filter 10b. In addition, since among the at least one parallel arm resonator configuring the first filter 10b, the parallel arm resonator p12 is located secondary nearby to the common terminal m1 and is likely to affect impedance seen from the common terminal m1 side of the first filter 10b, the impedance can be more flexibly adjusted by connecting the switch SW2 to the parallel arm resonator p12 as a parallel arm resonator other than the parallel arm resonator p11.

Other Preferred Embodiments

While the multiplexer and the high-frequency filter (first filter) according to preferred embodiments of the present invention have been described above, the present invention is not limited to the preferred embodiments described above. Other preferred embodiments which can be obtained by combining any of the components in the above preferred embodiments, modifications which can be obtained by those skilled in the art without departing from the spirit of the present invention, and various devices which incorporate a multiplexer and a high-frequency filter according to preferred embodiments of the present invention are also included in the present invention.

For example, in the preferred embodiments described above, although the multiplexer 1 is preferably a triplexer, it may alternatively be a duplexer, a quadplexer, or the like.

Further, for example, in the above preferred embodiments, the pass bands of the first filters 10, 10a, and 10b are preferably the Band 66Rx (about 2110 MHz to about 2200 MHz) of LTE, the pass band of the second filter 20 is preferably the Band 25Rx (about 1930 MHz to about 1995 MHz) of LTE, and the pass band of the third filter 30 is preferably the Band 30Rx (about 2350 MHz to about 2360 MHz) of LTE, which are only one example, and are appropriately determined according to the demand specifications.

Further, for example, although the second filter 20 and the third filter 30 are preferably ladder acoustic wave filters in the preferred embodiments described above, they may be an LC filter or the like.

Further, for example, in the above preferred embodiments, the switch SW1 is connected in series with the parallel arm resonator p11 which is connected most nearby to the common terminal m1, but may be connected in series with any of at least one parallel arm resonator. That is, the switch SW1 may not necessarily be connected in series with the parallel arm resonator p11 which is connected most nearby to the common terminal m1.

Preferred embodiments of the present invention can be widely used for communication apparatuses such as a cellular phone or the like as a multiplexer and a high-frequency filter which are applicable to a multiband system.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
    a plurality of filters; and
    a plurality of matching circuits respectively provided to the plurality of filters; wherein
    one input/output terminal of each of the plurality of filters is connected to a common terminal;
    a first filter included in the plurality of filters is a ladder filter, and includes:
        at least one series arm resonator connected on a path connecting the common terminal and another input/output terminal of the first filter;
        a plurality of parallel arm resonators connected between a corresponding connection node provided on the path and a ground; and
        a first switch which is connected in series with a first parallel arm resonator of the plurality of parallel arm resonators that is connected closest to the common terminal among the plurality of parallel arm resonators, and switches between conduction and non-conduction of the connection node to which the first parallel arm resonator is connected and the ground by a control signal from a controller;
    at least one of the plurality of parallel arm resonators is not connected in series with a switch that switches between conduction and non-conduction of the connection node to which the at least one of the parallel arm resonators is connected and the ground by a control signal from the controller;
    no switch is connected in parallel with any of the at least one series arm resonator; and
    the plurality of matching circuits adjust impedances between the plurality of filters and the common terminal.

2. The multiplexer according to claim 1, wherein
    the at least one series arm resonator includes at least two series arm resonators; and
    among the at least two series arm resonators, the first parallel arm resonator is connected to the connection node between a first series arm resonator connected most nearby to the common terminal and a second series arm resonator connected second most nearby to the common terminal.

3. The multiplexer according to claim 1, wherein the common terminal and the connection node to which the first parallel arm resonator is connected are connected to each other without any of the at least one series arm resonator between the common terminal and the connection node.

4. The multiplexer according to claim 1, wherein
    the plurality of parallel arm resonators include at least two parallel arm resonators;
    the first filter further includes a second switch; and
    the second switch is connected in series with a second parallel arm resonator connected closer to the other input/output terminal side than the first parallel arm resonator among the at least two parallel arm resonators, and switches between conduction and non-conduction of the connection node to which the second parallel arm resonator is connected and the ground.

5. The multiplexer according to claim 4, wherein the second parallel arm resonator is connected second most nearby to the common terminal among the at least two parallel arm resonators.

6. The multiplexer according to claim 1, wherein, when any one of the plurality of filters excluding the first filter is used, the first switch is made non-conductive.

7. The multiplexer according to claim 1, wherein the plurality of filters includes a filter having a pass band higher than a pass band of the first filter.

8. The multiplexer according to claim 7, wherein the first filter has the lowest pass band among the plurality of filters.

9. The multiplexer according to claim 1, wherein the plurality of parallel arm resonators include a second parallel arm resonator having a resonant frequency higher than a resonant frequency of the first parallel arm resonator.

10. The multiplexer according to claim 9, wherein the first parallel arm resonator is a parallel arm resonator having the lowest resonant frequency among the plurality of parallel arm resonators.

11. The multiplexer according to claim 1, wherein
    the at least one series arm resonator includes four series arm resonators;
    the plurality of parallel arm resonators include three parallel arm resonators; and
    each of the three parallel arm resonators is provided between respective adjacent ones of the four series arm resonators.

12. The multiplexer according to claim 1, wherein
    the plurality of filters include the first filter, a second filter, and a third filter which are all connected to the common terminal; and
    the common terminal is connected to an antenna.

* * * * *